United States Patent
Gao

(10) Patent No.: US 10,340,912 B2
(45) Date of Patent: Jul. 2, 2019

(54) POWER ON RESET CIRCUIT

(71) Applicant: CSMC TECHNOLOGIES FAB2 CO., LTD., Jiangsu (CN)

(72) Inventor: Yun Gao, Jiangsu (CN)

(73) Assignee: CSMC Technologies FAB2 Co., Ltd., Jiangsu (CN)

( * ) Notice: Subject to any disclaimer, the term of this patent is extended or adjusted under 35 U.S.C. 154(b) by 0 days.

(21) Appl. No.: 15/731,768

(22) PCT Filed: Sep. 17, 2015

(86) PCT No.: PCT/CN2015/089877
§ 371 (c)(1),
(2) Date: Jul. 28, 2017

(87) PCT Pub. No.: WO2016/119471
PCT Pub. Date: Aug. 4, 2016

(65) Prior Publication Data
US 2018/0375512 A1   Dec. 27, 2018

(30) Foreign Application Priority Data

Jan. 28, 2015   (CN) .......................... 2015 1 0045235

(51) Int. Cl.
*G06F 1/24*      (2006.01)
*H03K 17/22*    (2006.01)
(Continued)

(52) U.S. Cl.
CPC .............. *H03K 17/223* (2013.01); *G05F 3/24* (2013.01); *G06F 1/24* (2013.01); *H03K 17/22* (2013.01); *H03K 17/687* (2013.01)

(58) Field of Classification Search
CPC ...... H03K 17/223; H03K 17/687; G05F 3/24; G06F 1/24
(Continued)

(56) References Cited

U.S. PATENT DOCUMENTS 6,137,324 A * 10/2000 Chung ................. H03K 17/223
                                                              327/143
6,515,523 B1    2/2003 Bikulcius
(Continued)

FOREIGN PATENT DOCUMENTS

CN           103019295 A       4/2013
CN           103427812 A      12/2013
(Continued)

*Primary Examiner* — Dinh T Le
(74) *Attorney, Agent, or Firm* — Muncy, Geissler, Olds & Lowe, P.C.

(57)               ABSTRACT

A power on reset circuit, comprising: a threshold level control circuit (120) configured to set threshold level values of power on reset and power off reset; a capacitor charge and discharge circuit (130) configured to output a power on reset signal according to the threshold level values set by the threshold level control circuit; and a current bias circuit (110) configured to provide a reference current not varying with a power supply to the threshold level control circuit (120) and the capacitor charge and discharge circuit (130), comprising: a first reference current output terminal connected to the threshold level control circuit (120); a second reference current output terminal connected to the capacitor charge and discharge circuit (130); and a third reference current output terminal connected to the capacitor charge and discharge circuit (130).

10 Claims, 6 Drawing Sheets

(51) Int. Cl.
*G05F 3/24* (2006.01)
*H03K 17/687* (2006.01)

(58) Field of Classification Search
USPC .................................................. 327/140–143
See application file for complete search history.

(56) References Cited

U.S. PATENT DOCUMENTS

| | | | | |
|---|---|---|---|---|
| 6,870,779 | B2 * | 3/2005 | Kang | G11C 11/22 |
| | | | | 365/189.09 |
| 7,564,278 | B2 * | 7/2009 | Chen | H03K 17/223 |
| | | | | 327/142 |

FOREIGN PATENT DOCUMENTS

| | | |
|---|---|---|
| CN | 103633974 A | 3/2014 |
| CN | 103997323 A | 8/2014 |
| JP | 2008-048298 A | 2/2008 |
| JP | 2013037617 A | 2/2013 |

\* cited by examiner

POWER ON RESET CIRCUIT

FIELD OF THE INVENTION

The present invention relates to a field of control of integrated circuit, and particularly relates to a power on reset circuit.

BACKGROUND OF THE INVENTION

A power on reset circuit is substantially built in the conventional chip. There are many types of power-on reset circuits. Currently, it is most widely applied that the power on reset (POR) signal is generated by using resistance-capacitance, Schmitt triggers or inverters.

However, when the conventional power on reset circuit converts the level by using the inverter, the anti-interference ability of the conventional power on reset circuit for the power supply disturbance is relatively poor, that is to say, when the power supply jitters near converting the level by the inverter, the inverter will convert the level continually and generate a series of unstable POR signals. Such a phenomenon is called a false triggering, so that the chip cannot work normally. The circuit that uses the Schmitt trigger to convert the level has a certain anti-interference capability. However, it is difficult to set the upper and lower threshold levels of the Schmitt trigger accurately, and the threshold levels vary with the fluctuation of the power supply voltage. Therefore, it is difficult to accurately modulate threshold levels of the power on reset, so that the resulting POR signal is unstable.

SUMMARY OF THE INVENTION

Accordingly, it is necessary to provide a power on reset circuit, which can generate a stable power on reset signal.

A power on reset circuit includes:

a threshold level control circuit configured to set threshold level values of power on reset and power off reset;

a capacitor charge and discharge circuit configured to output a power on reset signal according to the threshold level values set by the threshold level control circuit; and a current bias circuit configured to provide a reference current not varying with a power supply to the threshold level control circuit and the capacitor charge and discharge circuit, including:

a first reference current output terminal connected to the threshold level control circuit;

a second reference current output terminal connected to the capacitor charge and discharge circuit; and a third reference current output terminal connected to the capacitor charge and discharge circuit.

According to the above power on reset circuit, the current bias circuit provides three reference currents not varying with a power supply to the threshold level control circuit and the capacitor charge and discharge circuit. Such threshold level control circuit generates accurate threshold level values by reference currents provided by the current bias circuit; the capacitor charge and discharge circuit enables the capacitor charge and discharge times to be calculated accurately by reference currents provided by the current bias circuit; in the case whether the power supply performs a quick power on operation or a slow power on operation, the capacitor charge and discharge circuit can generate a stable power on reset signal.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Figure 1:
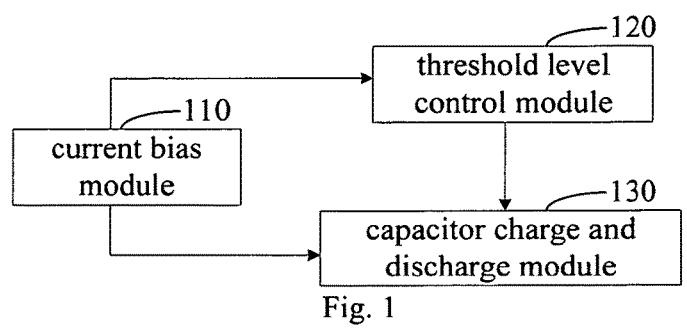
FIG. 1 is a block diagram of a power on reset circuit according to an embodiment.

Referring to FIG. 1, in an embodiment, a power on reset circuit includes a current bias circuit 110, a threshold level control circuit 120 and a capacitor charge and discharge circuit 130.

The current bias circuit 110 is configured to provide a reference current not varying with a power supply to the threshold level control circuit 120 and the capacitor charge and discharge circuit 130. In the embodiment, the current bias circuit 110 includes a first reference current output terminal Ibias1, a second reference current output terminal Ibias2 and a third reference current output terminal Ibias3. The first reference current output terminal Ibias1 is connected to the threshold level control circuit 120; the second reference current output terminal Ibias2 and the third reference current output terminal Ibias3 are connected to the capacitor charge and discharge circuit 130.

Figure 2:
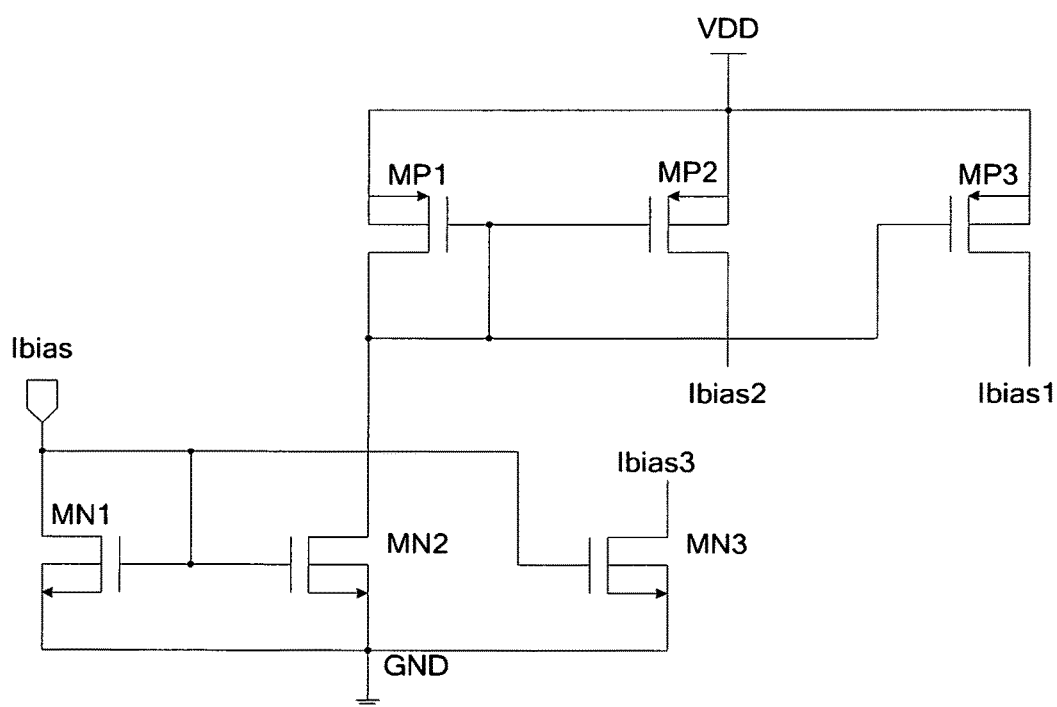
FIG. 2 is a circuit diagram of a current bias circuit in the embodiment shown by FIG. 1.

Referring to FIG. 2, the current bias circuit 110 includes a first field effect transistor MN1, a second field effect transistor MN2, a third field effect transistor MN3, a fourth field effect transistor MP1, a fifth field effect transistor MP2 and a sixth field effect transistor MP3.

A gate of the first field effect transistor MN1 is connected to a drain thereof; the drain of the first field effect transistor MN1 is externally connected to a reference current source Ibias. Sources of the first field effect transistor MN1, the second field effect transistor MN2 and the third field effect transistor MN3 are grounded GND; a gate of the second field effect transistor MN2 is connected to the gate of the first field effect transistor MN1; a drain of the second field effect transistor MN2 is connected to a drain of the fourth field effect transistor MP1; a gate of the third field effect transistor MN3 is connected to the gate of the first field effect transistor MN1; a drain of the third field effect transistor MN3 serves as the third reference current output terminal Ibias3. A gate of the fourth field effect transistor MP1 is connected to a drain of the fourth field effect transistor MP1;

a gate of the fifth field effect transistor MP2 is connected to the gate of the fourth field effect transistor MP1; sources of the fourth field effect transistor MP1, the fifth field effect transistor MP2 and the sixth field effect transistor MP3 are connected to the power supply VDD; a drain of the fifth field effect transistor MP2 serves as the second reference current output terminal Ibias2; a gate of the sixth field effect transistor MP3 is connected to the gate of the fourth field effect transistor MP1; and a drain of the sixth field effect transistor MP3 serves as the first reference current output terminal Ibias1.

In the embodiment, the first field effect transistor MN1, the second field effect transistor MN2 and the third field effect transistor MN3 are N-type field effect transistors; the fourth field effect transistor MP1, the fifth field effect transistor MP2 and the sixth field effect transistor MP3 are P-type field effect transistors.

Figure 3:
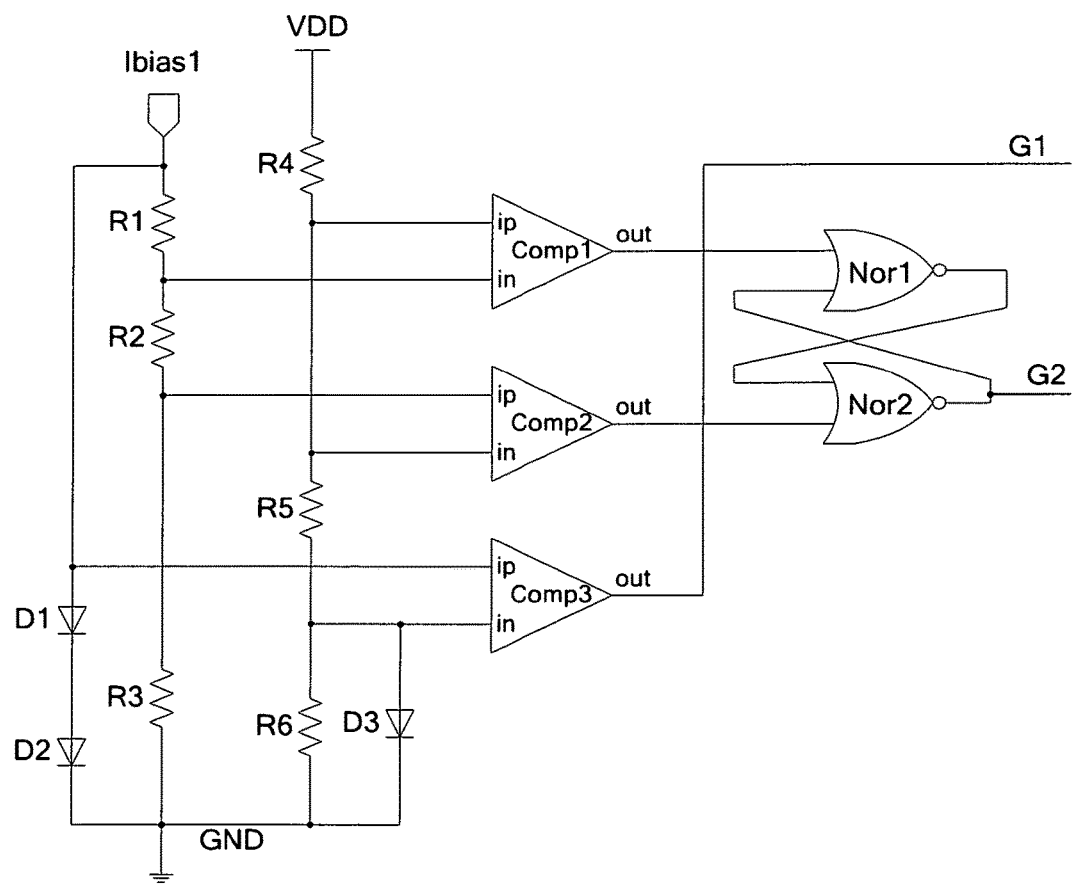
FIG. 3 is a circuit diagram of a threshold level control circuit in the embodiment shown by FIG. 1.

The threshold level control circuit 120 is configured to set threshold level values of power on reset and power off reset, with reference to FIG. 3.

The threshold level control circuit includes a first resistor R1, a second resistor R2, a third resistor R3, a fourth resistor R4, a fifth resistor R5, a sixth resistor R6, a first diode D1, a second diode D2, a third diode D3, a first comparator Comp1, a second comparator Comp2, a third comparator Comp3, a first NOR gate Nor1 and a second NOR gate Nor2.

The first resistor R1, the second resistor R2 and the third resistor R3 are connected in series between the first reference current output terminal Ibias1 and the ground GND; the fourth resistor R4, the fifth resistor R5 and the sixth resistor R6 are connected in series between the power supply VDD and the ground GND.

A non-inverting input terminal ip of the first comparator Comp1 is connected between the fourth resistor R4 and the fifth resistor R5; an inverting input terminal in of the first comparator Comp1 is connected between the first resistor R1 and the second resistor R2; an output terminal out of the first comparator Comp1 is connected to a first input terminal of the first NOR gate Nor1.

A non-inverting input terminal ip of the second comparator Comp2 is connected between the second resistor R2 and the third resistor R3; an inverting input terminal in of the second comparator Comp2 is connected between the fourth resistor R4 and the fifth resistor R5; an output terminal out of the second comparator Comp2 is connected to a first input terminal of the second NOR gate Nor2.

A non-inverting input terminal ip of the third comparator Comp3 and an anode of the first diode D1 are connected to the first reference current output terminal Ibias1; an inverting input terminal in of the third comparator Comp3 is connected between the fifth resistor R5 and the sixth resistor R6; an output terminal out of the third comparator Comp3 is connected to the capacitor charge and discharge circuit 130; particularly, the output terminal out of the third comparator Comp3 is connected to G1.

A cathode of the first diode D1 is connected to an anode of the second diode D2; a cathode of the second diode D2 is grounded. The third diode is connected between the inverting input terminal in of the third comparator Comp3 and the ground. An output terminal of the first NOR gate Nor1 is connected to a second input terminal of the second NOR gate Nor2; an output terminal of the second NOR gate Nor2 is connected to a second input terminal of the first NOR gate Nor1 and the capacitor charge and discharge circuit 130; particularly, the output terminal of the second NOR gate Nor2 is connected to G2.

Because the reference current source Ibias externally connected by the current bias circuit 110 is generally from the reference power supply circuit in the chip, if the power on time of the power supply VDD is less than the establishment time of the reference voltage power supply circuit in the chip, then the circuit will fail. The first diode D1 and the second diode D2 connected in series can ensure the capacitor charge and discharge circuit 130 will not generate the POR signal before the reference voltage source Ibias is established.

Figure 4:
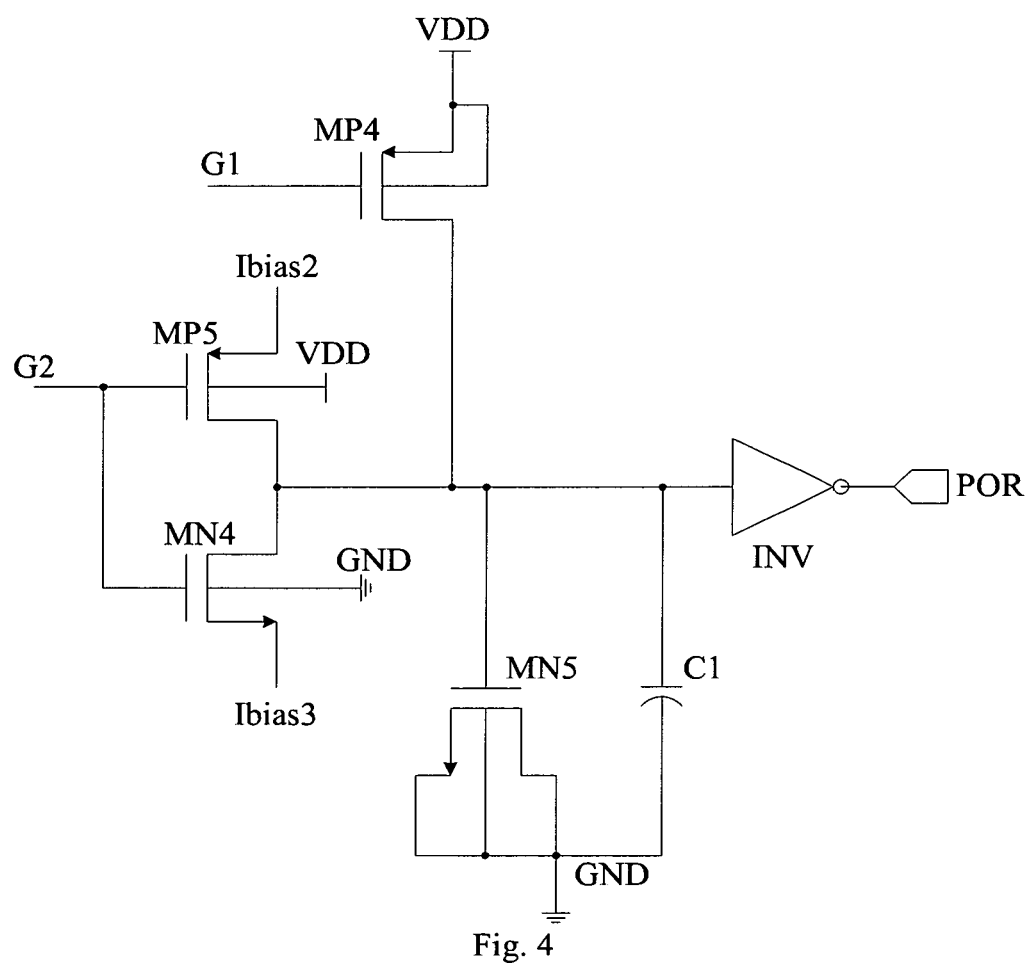
FIG. 4 is a circuit diagram of a capacitor charge and discharge circuit in the embodiment shown by FIG. 1.

The capacitor charge and discharge circuit 130 is configured to output POR according to the threshold level values set by the threshold level control circuit 120, with reference to FIG. 4.

The capacitor charge and discharge circuit includes a seventh field effect transistor MP4, a eighth field effect transistor MP5, a ninth field effect transistor MN4, a tenth field effect transistor MN5, a first capacitor C1 and an inverter INV.

A source of the seventh field effect transistor MP4 is connected to the power supply VDD; a drain of the seventh field effect transistor MP4 is connected to a drain of the eighth field effect transistor MP5, a drain of the ninth field effect transistor MN4, a gate of the tenth field effect transistor MN5, an anode of the first capacitor C1 and an input terminal of the inverter INV respectively; a gate of the seventh field effect transistor MP4 is connected to G1; sources of the eighth field effect transistor MP5 and the ninth field effect transistor MN4 are connected to the second reference current output terminal Ibias2 and the third reference current output terminal Ibias3 respectively; a gate of the eighth field effect transistor MP5 is connected to G2; a source and a drain of the tenth field effect transistor MN5 are grounded GND; a cathode of the first capacitor C1 is grounded; and an output of the inverter INV outputs POR.

The working principle of the power on reset circuit is illustrated with reference to FIG. 1 to FIG. 4 in the following.

The reference current source Ibias externally connected provides three reference currents not varying with the power supply VDD via the current bias circuit 110. The first reference current output terminal Ibias1 is connected to the first resistor R1, the second resistor R2 and the third resistor R3 connected in series, and then more accurate upper threshold level and lower threshold level are generate. Given that the current value output by the first reference current output terminal Ibias1 is $I_1$, the resistance values of the first resistor R1, the second resistor R2 and the third resistor R3 are $R_1$, $R_2$ and $R_3$ respectively, then the upper threshold level is $I_1 \times (R_2 + R_3)$ and the lower threshold level is $I_1 \times R_3$; that is to say, the difference between the upper threshold level and the lower threshold level is $I_1 \times R_2$.

It can be understood that in other embodiments, the second resistor R2 and the third resistor R3 connected in series can be replaced by N resistors with lower resistance values connected in series, wherein N is not less than 2; more accurate upper threshold level and lower threshold level can be obtained by finely adjusting the number of resistors connected in series. Meanwhile, the difference between threshold levels can be adjusted flexibly, which can implement the anti-interference capacity of the power supply in different chip applications.

The fourth resistor R4, the fifth resistor R5 and the sixth resistor R6 connected in series and cooperated with each other can implement that the power supply VDD can generate POR signals at different voltage values. For example, when resistance values of the fourth resistor R4, the fifth resistor R5 and the sixth resistor R6 are same, the corresponding power supply voltage are $1.5 \times I_1 \times (R_2+R_3)$, $1.5 \times I_1 \times R_3$ respectively when upper threshold level and lower threshold level generate POR. Therefore, the fourth resistor R4, the fifth resistor R5 and the sixth resistor R6 can implement coarse adjustment of voltage values when the power supply VDD generates POR signals, and the first resistor R1, the second resistor R2 and the third resistor R3 can implement fine adjustment of such voltage values.

Currents output by the second reference current output terminal Ibias2 and the third reference current output terminal Ibias3 provided by the current bias circuit 110 are charge current and discharge current in the capacitor charge and discharge circuit 130 respectively. Current values of these two current sources can be set according to practical application situation.

In the embodiment, the current value output by the second reference current output terminal Ibias2 is the double of the current value output by the third reference current output terminal Ibias3. It can be understood that in other embodiments, it only needs to make sure that the current value output by the second reference current output terminal Ibias2 is an integer multiple of the current value output by the third reference current output terminal Ibias3.

Because the bias current does not vary with the power supply VDD, the charge time can be calculated accurately: $T_1=(V_1 \times C_1)/I_2$. Similarly, the discharge time can be calculated accurately: $T_2=2 \times (V_1-V_2) \times C_1/I_2$; wherein $V_1$ is the voltage value of the gate of the tenth field effect transistor MN5; $C_1$ is a sum of the capacitance value of the tenth field effect transistor MN5 and the capacitance value of the first capacitor C1; $I_2$ is the current value output by the second reference current output terminal Ibias2; $V_2$ is the corresponding conversion level value of the inverter INV.

When the power supply VDD performs a power on operation, the voltage V3 between the fourth resistor R4 and the fifth resistor R5 follows up in proportion; the first comparator Comp1 outputs "0"; the second comparator Comp2 outputs "1"; the second NOR gate Nor2 outputs "0"; the eighth field effect transistor MP5 is turned on; the current output by the second reference current output terminal Ibias2 charges the first capacitor C1; the gate voltage of the tenth field effect transistor MN5 raises; the inverter INV outputs "0".

When the voltage V3 between the fourth resistor R4 and the fifth resistor R5 raises to the lower threshold level, the first comparator Comp1 outputs "0"; the second comparator Comp2 outputs "0"; the second NOR gate Nor2 outputs "0"; the current output by the second reference current output terminal IBias2 continues to charge the first capacitor C1; the inverter still outputs "0"; when the voltage V3 between the fourth resistor R4 and the fifth resistor R5 raises to the upper threshold level, the first comparator Comp1 outputs "1"; the second comparator Comp2 outputs "0"; the second NOR gate Nor2 outputs "1"; the first capacitor C1 begins to discharge; the inverter outputs "1"; the POR signal is generated.

When the power supply VDD performs a power off operation, the voltage V3 between the fourth resistor R4 and the fifth resistor R5 begins to decrease; when the voltage V3 decreases to the upper threshold level, the first comparator Comp1 outputs "0"; the second comparator Comp2 outputs "0"; the second NOR gate Nor2 outputs "1"; the inverter INV still outputs "1"; when the voltage V3 between the fourth resistor R4 and the fifth resistor R5 decreases to the lower threshold level, the first comparator Comp1 outputs "0"; the second comparator Comp2 outputs "1"; the second NOR gate Nor2 outputs "0"; the inverter INV outputs "0".

Figure 5:
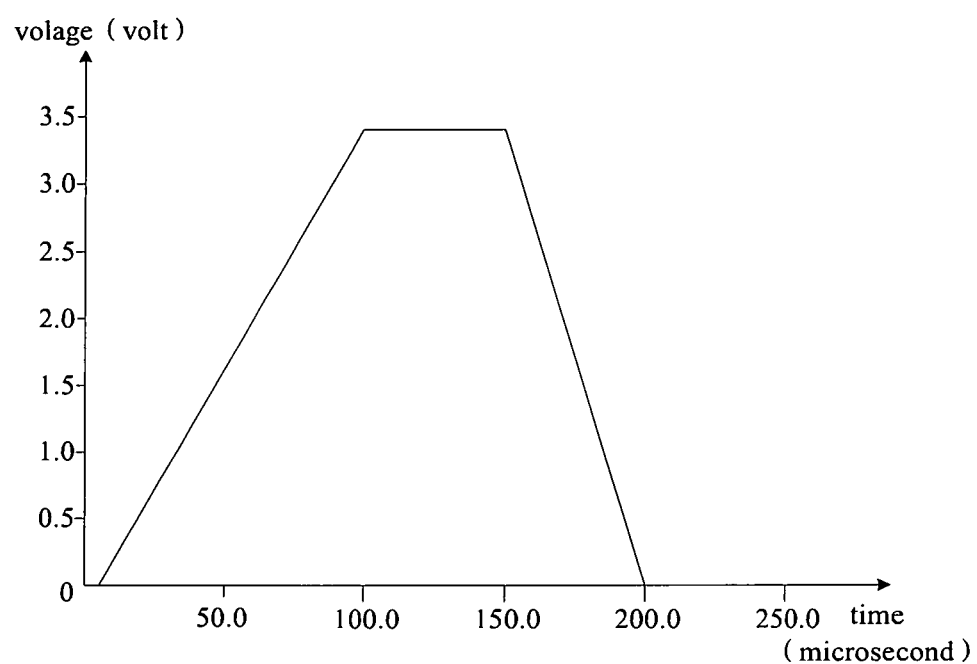
FIG. 5 is a simulated waveform diagram of the power supply voltage during power on and power off in the normal case in an embodiment.
Figure 6:
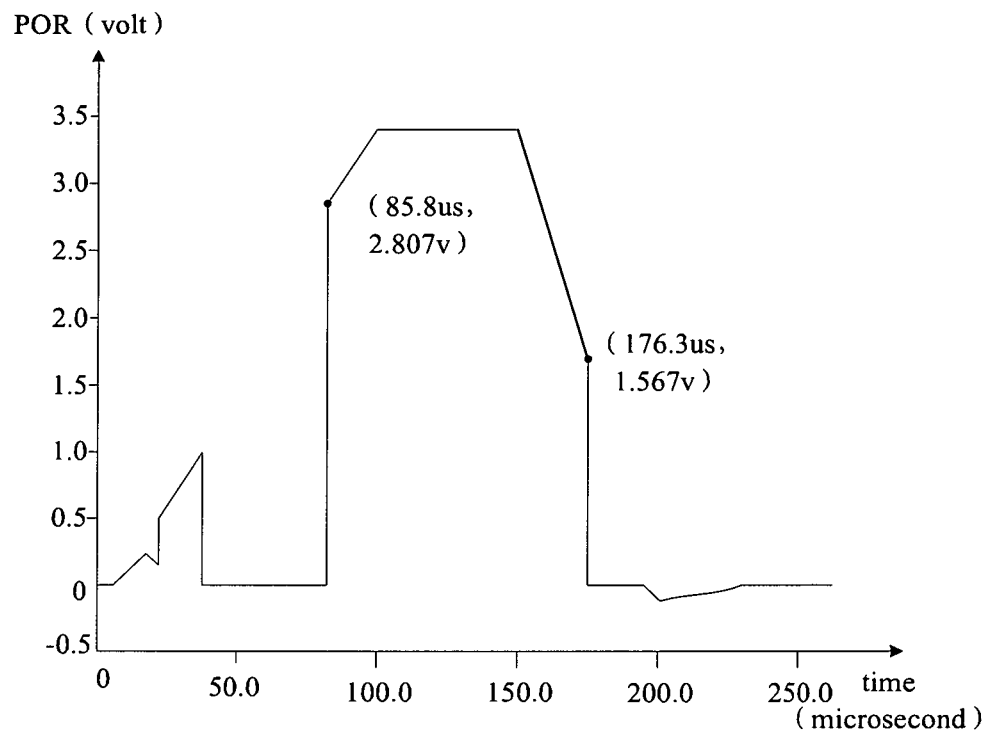
FIG. 6 is a simulated waveform diagram of the corresponding POR signal voltage in the embodiment shown by FIG. 5.
Figure 7:
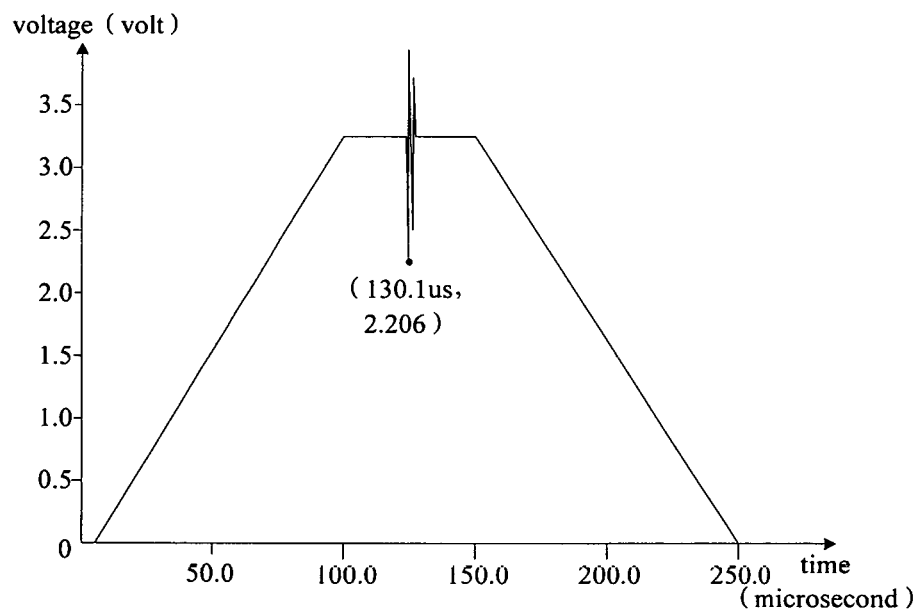
FIG. 7 is a simulated waveform diagram of the power supply voltage during power on and power off when fluctuation of the power supply is 30%.
Figure 8:
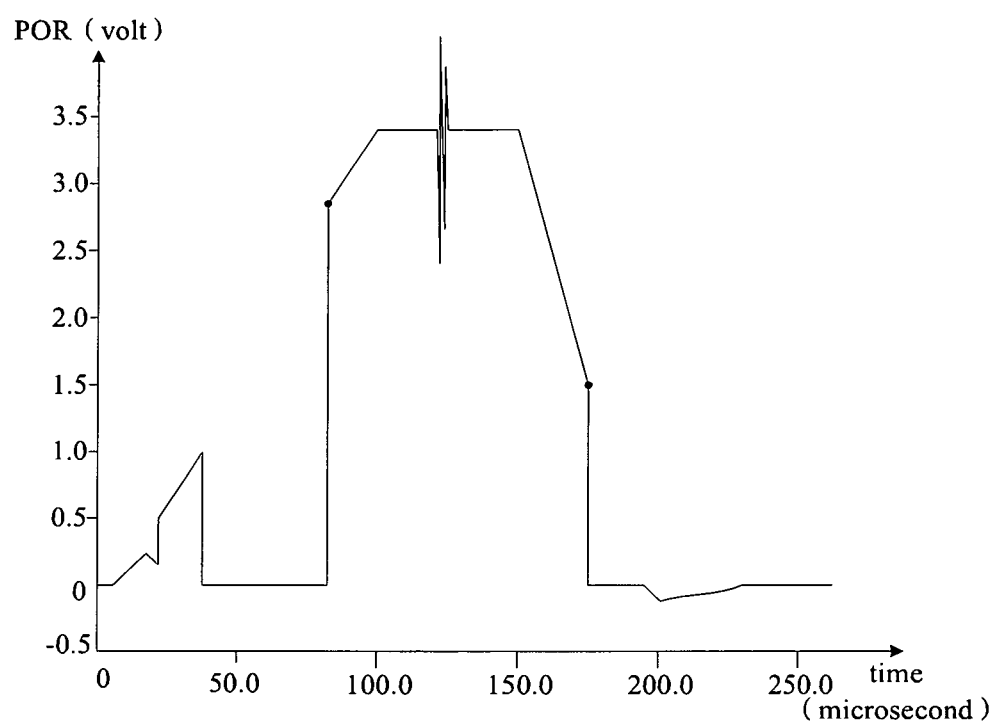
FIG. 8 is a simulated waveform diagram of the corresponding POR signal voltage in the embodiment shown by FIG. 7.

Simulated waveforms of the power on reset circuit during power on and power off are shown in FIG. 5 to FIG. 8; wherein FIG. 5 is a simulated waveform diagram of the power supply voltage during power on and power off in the normal case; FIG. 6 is a simulated waveform diagram of the corresponding POR signal voltage; FIG. 7 is a simulated waveform diagram of the power supply voltage during power on and power off when fluctuation of the power supply is 30%; FIG. 8 is a simulated waveform diagram of the corresponding POR signal voltage.

When the voltage of the power supply VDD raises to 2.807V of the upper threshold level, the circuit generates the POR signal; when the voltage of the power supply VDD decreases to 1.567V of the lower threshold level, the POR signal immediately decreases to 0, which significantly improves the anti-interference capacity of the power supply voltage VDD.

As shown in FIG. 8, even if fluctuation of the power supply voltage VDD is 30%, a false triggering of the POR signal will not be generated.

For the above power on reset circuit, the current bias circuit provides three reference currents not varying with the power supply to the threshold level control circuit and the capacitor charge and discharge circuit. Such threshold level control circuit generates accurate threshold level values by reference currents provided by the current bias circuit; the capacitor charge and discharge circuit enables the capacitor charge and discharge times to be calculated accurately by reference currents provided by the current bias circuit; in the case whether the power supply performs a quick power on operation or a slow power on operation, the capacitor charge and discharge circuit can generate a stable power on reset signal.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A power on reset circuit, comprising:
   a threshold level control circuit configured to set threshold level values during power on reset and power off reset operations;
   a capacitor charge and discharge circuit connected to the threshold level control circuit and configured to output a power on reset signal according to the threshold level values set by the threshold level control circuit; and
   a current bias circuit configured to provide a reference current not varying with a power supply coupled to the threshold level control circuit and the capacitor charge and discharge circuit, the current bias circuit comprising:
   a first reference current output terminal connected to the threshold level control circuit;
   a second reference current output terminal connected to the capacitor charge and discharge circuit; and
   a third reference current output terminal connected to the capacitor charge and discharge circuit.

2. The power on reset circuit of claim 1, wherein the current bias circuit comprises: a first field effect transistor, a second field effect transistor, a third field effect transistor, a fourth field effect transistor, a fifth field effect transistor and a sixth field effect transistor; wherein a gate of the first field effect transistor is connected to a drain thereof; the drain of the first field effect transistor is externally connected to a reference current source; sources of the first field effect transistor, the second field effect transistor and the third field effect transistor are grounded; a gate of the second field effect transistor is connected to the gate of the first field effect transistor; a drain of the second field effect transistor is connected to a drain of the fourth field effect transistor; a gate of the third field effect transistor is connected to the gate of the first field effect transistor; a drain of the third field effect transistor serves as the third reference current output terminal; sources of the fourth field effect transistor, the fifth field effect transistor and the sixth field effect transistor are connected to the power supply; a gate of the fourth field effect transistor is connected to a drain thereof and gates of the fifth field effect transistor and the sixth field effect transistor; a drain of the fifth field effect transistor serves as the second reference current output terminal; and a drain of the sixth field effect transistor serves as the first reference current output terminal.

3. The power on reset circuit of claim 2, wherein the first field effect transistor, the second field effect transistor and the third field effect transistor are N-type field effect transistors; the fourth field effect transistor, the fifth field effect transistor and the sixth field effect transistor are P-type field effect transistors.

4. The power on reset circuit of claim 1, wherein the threshold level control circuit comprises a first diode and a second diode connected in series; wherein an anode of the first diode is connected to the first reference current output terminal; a cathode of the first diode is connected to an anode of the second diode; and a cathode of the second diode is grounded.

5. The power on reset circuit of claim 4, wherein the threshold level control circuit further comprises a first resistor, a second resistor, a third resistor, a fourth resistor, a fifth resistor, a sixth resistor, a third diode, a first comparator, a second comparator, a third comparator, a first NOR gate and a second NOR gate; wherein, the first resistor, the second resistor and the third resistor are connected in series between the first reference current output terminal and the ground; the fourth resistor, the fifth resistor and the sixth resistor are connected in series between the power supply and the ground;
a non-inverting input terminal of the first comparator is connected between the fourth resistor and the fifth resistor; an inverting input terminal of the first comparator is connected between the first resistor and the second resistor; an output terminal of the first comparator is connected to a first input terminal of the first NOR gate;
a non-inverting input terminal of the second comparator is connected between the second resistor and the third resistor; an inverting input terminal of the second comparator is connected between the fourth resistor and the fifth resistor; an output terminal of the second comparator is connected to a first input terminal of the second NOR gate;
a non-inverting input terminal of the third comparator is connected to the first reference current output terminal; an inverting input terminal of the third comparator is connected between the fifth resistor and the sixth resistor; an output terminal of the third comparator is connected to the capacitor charge and discharge circuit;
the third diode is connected between the inverting input terminal of the third comparator and the ground;
an output terminal of the first NOR gate is connected to a second input terminal of the second NOR gate; an output terminal of the second NOR gate is connected to a second input terminal of the first NOR gate and the capacitor charge and discharge circuit.

6. The power on reset circuit of claim 1, wherein the capacitor charge and discharge circuit comprises: a seventh field effect transistor, a eighth field effect transistor, a ninth field effect transistor, a tenth field effect transistor, a first capacitor and an inverter; wherein
a source of the seventh field effect transistor is connected to the power supply; a drain of the seventh field effect transistor is connected to a drain of the eighth field effect transistor, a drain of the ninth field effect transistor, a gate of the tenth field effect transistor, an anode of the first capacitor and an input terminal of the inverter respectively; sources of the eighth field effect transistor and the ninth field effect transistor are connected to the second reference current output terminal and the third reference current output terminal respectively; a source and a drain of the tenth field effect transistor and a cathode of the first capacitor are grounded; and an output of the inverter outputs the power on reset signal.

7. The power on reset circuit of claim 6, wherein the seventh field effect transistor and the eighth field effect transistor are P-type field effect transistors; the ninth field effect transistor and tenth field effect transistor are N-type field effect transistors.

8. The power on reset circuit of claim 6, wherein the first capacitor is a MIM capacitor.

9. The power on reset circuit of claim 1, wherein a current value output by the second reference current output terminal is an integer multiple of a current value output by the third reference current output terminal.

10. The power on reset circuit of claim 9, wherein the current value output by the second reference current output terminal is the double of the current value output by the third reference current output terminal.

* * * * *